(12) United States Patent
Brown

(10) Patent No.: US 6,612,015 B2
(45) Date of Patent: Sep. 2, 2003

(54) METHOD FOR MAKING A GALVANOMETER WITH AXIAL SYMMETRY

(75) Inventor: David C. Brown, Northborough, MA (US)

(73) Assignee: GSI Lumonics Corporation, Billerica, MA (US)

(*) Notice: Subject to any disclaimer, the term of this patent is extended or adjusted under 35 U.S.C. 154(b) by 0 days.

(21) Appl. No.: 10/029,470

(22) Filed: Oct. 22, 2001

(65) Prior Publication Data

US 2002/0059715 A1 May 23, 2002

Related U.S. Application Data

(63) Continuation of application No. 09/475,539, filed on Dec. 30, 1999, now Pat. No. 6,307,292.

(51) Int. Cl.[7] .............................. H02K 15/00; H01F 7/06
(52) U.S. Cl. ........................................... 29/596; 29/607
(58) Field of Search ..................... 29/596, 607; 310/49, 310/90; 384/493, 905

(56) References Cited

U.S. PATENT DOCUMENTS

| | | | | |
|---|---|---|---|---|
| 3,326,613 A | * | 6/1967 | Renker | ......................... 384/493 |
| 3,624,574 A | * | 11/1971 | Montagu | .................... 335/210 |
| 4,076,191 A | | 2/1978 | Binge | |
| 4,135,119 A | | 1/1979 | Brosens | |
| 4,189,699 A | | 2/1980 | Burke, Jr. | |
| 4,370,613 A | * | 1/1983 | Montagu | ................. 324/154 R |
| 4,845,424 A | * | 7/1989 | Gamble | ........................ 324/146 |
| 4,867,581 A | | 9/1989 | Schmidt et al. | |
| 5,424,632 A | | 6/1995 | Montagu | |
| 6,135,641 A | * | 10/2000 | Smith | .......................... 384/493 |

FOREIGN PATENT DOCUMENTS

| | | | | |
|---|---|---|---|---|
| JP | 63-064554 | * | 3/1988 | .......... H02K/17/15 |
| JP | 08-289498 | * | 11/1996 | .......... H02K/5/173 |

\* cited by examiner

Primary Examiner—Carl J. Arbes
Assistant Examiner—Thiem D Phan
(74) Attorney, Agent, or Firm—Cesari and McKenna, LLP

(57) ABSTRACT

A method of fabricating a limited-rotation motor that is characterized by axial stability of a rotor that includes a permanent-magnet armature and further characterized by a relatively small inherent axial force on the rotor. The rotor is supported by a pair of ball-bearing units and axial stability is provided by preloading the bearing unit at the end of the rotor with a relatively stiff spring and preloading the bearing at the second end with a relatively weak spring, whereby thermal expansion and contraction of the rotor are accommodated almost entirely by a movement of the second end of the rotor.

A low axial force on the rotor is obtained by forming the armature with a split mold so that uniform compression is extended along the entire armature, resulting in relatively uniform magnetic properties, and by positioning the corresponding stator elements symmetrically relative to the magnetic center of the armature.

4 Claims, 4 Drawing Sheets

METHOD FOR MAKING A GALVANOMETER WITH AXIAL SYMMETRY

CROSS-REFERENCE TO RELATED APPLICATIONS

The present application is a continuation of commonly assigned U.S. patent application Ser. No. 09/475,539 which was filed on Dec. 30$^{th}$, 1999, now U.S. Pat. No. 6,307,292 by David C. Brown for a Galvanometer with Axial Symmetry and Improved Bearing Design and is hereby incorporated by reference.

BACKGROUND OF THE INVENTION

This invention relates to limited-rotation motors or galvanometers, and more particularly to that class in which the rotor is supported on ball bearings. The invention also relates to a novel bearing unit that uses a preload characterized by a high spring constant.

These devices often perform precision tasks that require a high degree of accuracy. Common uses of these devices include electronic manufacturing and repair operations in which a laser beam is directed to perform tasks such as the profiling, marking, cutting, drilling, and trimming of silicon and other semi-conducting materials. The galvanometers are also used in high-precision optical scanning operations in which a laser beam is swept over a field of interest and reflections of the beam are sensed and analyzed. To perform these precision tasks, limited-rotation motors are equipped with means for monitoring and reporting the instantaneous angular positions of the rotors.

As described herein, the rotor may comprise a cylindrical permanent magnet armature and a pair of shafts that support the armature for rotation in ball bearings. Several factors influence the service life of these bearings and the axial position of the rotor, which in turn affect the accuracy of these devices. For example, in high precision applications of the galvanometer, bearing slackness, which results in radial movements of the rotor, results in substantial degradation of the accuracy of the beam positioning. Therefore, the bearings are preloaded by means of a spring arrangement to remove the slack. However, conventional preloading systems do not perform satisfactorily in the applications to which this invention is directed.

More specifically, a substantial amount of heat is generated in a galvanometer in a continuous-use environment such as high-speed scanning. The resulting temperature changes cause expansion and contraction of the armature. If the preload spring has a high spring constant, these dimensional changes can cause a relatively large change in the force exerted by the preload spring, resulting in excessive bearing wear in one direction and inadequate preload in the other direction.

A preload spring having a relatively low spring constant will avoid excessive changes in the preload force in response to thermal expansion and contraction. However, the low spring constant causes another problem. Because of various asymmetries in the system, a time-varying axial force is exerted on the rotor. The resulting axial displacement of the rotor is a chatter characterized by a resonance involving the mass of the rotor (and load) and the spring constant of the preload spring. If the resonant frequency is within the passband of the servo system that drives the galvanometer, the relatively large axial displacement at this frequency will be sensed by the angular-position sensor that provides a feedback signal. This will cause instability in the servo system. Accordingly, the passband is limited to frequencies below the resonance, which has a low frequency owing to the low spring constant.

In addition, conventional galvanometer design has not recognized that axial placement of the bearings, stator drive coils, and stator back iron can also profoundly affect the axial forces applied to the bearings during acceleration of the rotor assembly. As a result, insufficient attention has been devoted to placing these elements in an axially symmetric relationship with respect to the magnetic center of the armature, and unnecessarily large axial forces have been applied to the bearings, shortening their life considerably.

Therefore, what is needed, is an efficient, high-performance galvanometer bearing assembly design, which extends the service life of the bearings, while providing accurate performance. Such a bearing design would provide the stiffness of a high preload design, thereby avoiding problems resulting from chatter and would also provide the compliance of a low preload design that would account for bearing wear and differential thermal expansion of the rotor components.

SUMMARY OF THE INVENTION

A galvanometer as it is to be understood in the present context is a limited-rotation motor equipped with means for monitoring and reporting the instantaneous angular position of the rotor. In the preferred embodiment of the invention, the rotor is equipped with an output shaft, supported by a novel duplex pair bearing unit, to which may be attached an arbitrary load, and a tail shaft supported by a second bearing assembly. The duplex pair bearing assembly has pairs of inner and outer races, wherein a preload is established by urging the pair of inner races, either toward or away from each other, into an offset position from the pair of outer races so as to take up the slack. The inner and outer races are axially restrained with regard to the output shaft and the motor housing, respectively.

The preloaded bearing assembly has a high spring constant, which maintains the rotor in an essentially fixed axial position with respect to the motor housing. Therefore, such axial movement of the rotor that does occur is characterized by a relatively high resonant frequency. In addition, each of the components of the preloaded duplex pair bearing assembly is preferably fabricated from the same material so that the bearing assembly does not incur a change in preload as a result of thermal expansion or contraction.

At the other end of armature, the tail shaft is mounted in a conventional second bearing unit preloaded with a low spring constant relative to that of the first bearing unit. Because of the stiffness the first bearing unit, thermal expansion and contraction of the rotor assembly is taken up almost entirely in the second bearing unit. Because the second bearing unit is preloaded with a spring having a relatively low spring constant, thermal expansion does not cause a large change in the preloading in this unit.

Another important consideration in designing a galvanometer is the proper positioning of the internal components such as the bearings, stator drive coils and stator back iron. Another novel feature of the present invention is that these elements are arranged symmetrically with the magnetic center of the rotor, thereby greatly reducing the parasitic axial bearing forces, and prolonging the life of the bearings.

A further novel feature of the present invention is that the rotor magnet is manufactured to or selected for a high degree of property uniformity along its length. As the property uniformity of the magnet increases so does the torque constant of the rotor. An increase in magnetic property uniformity also decreases the inherent axial loading of the bearings, thereby facilitating the design and use of the preloading spring for the second bearing unit.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
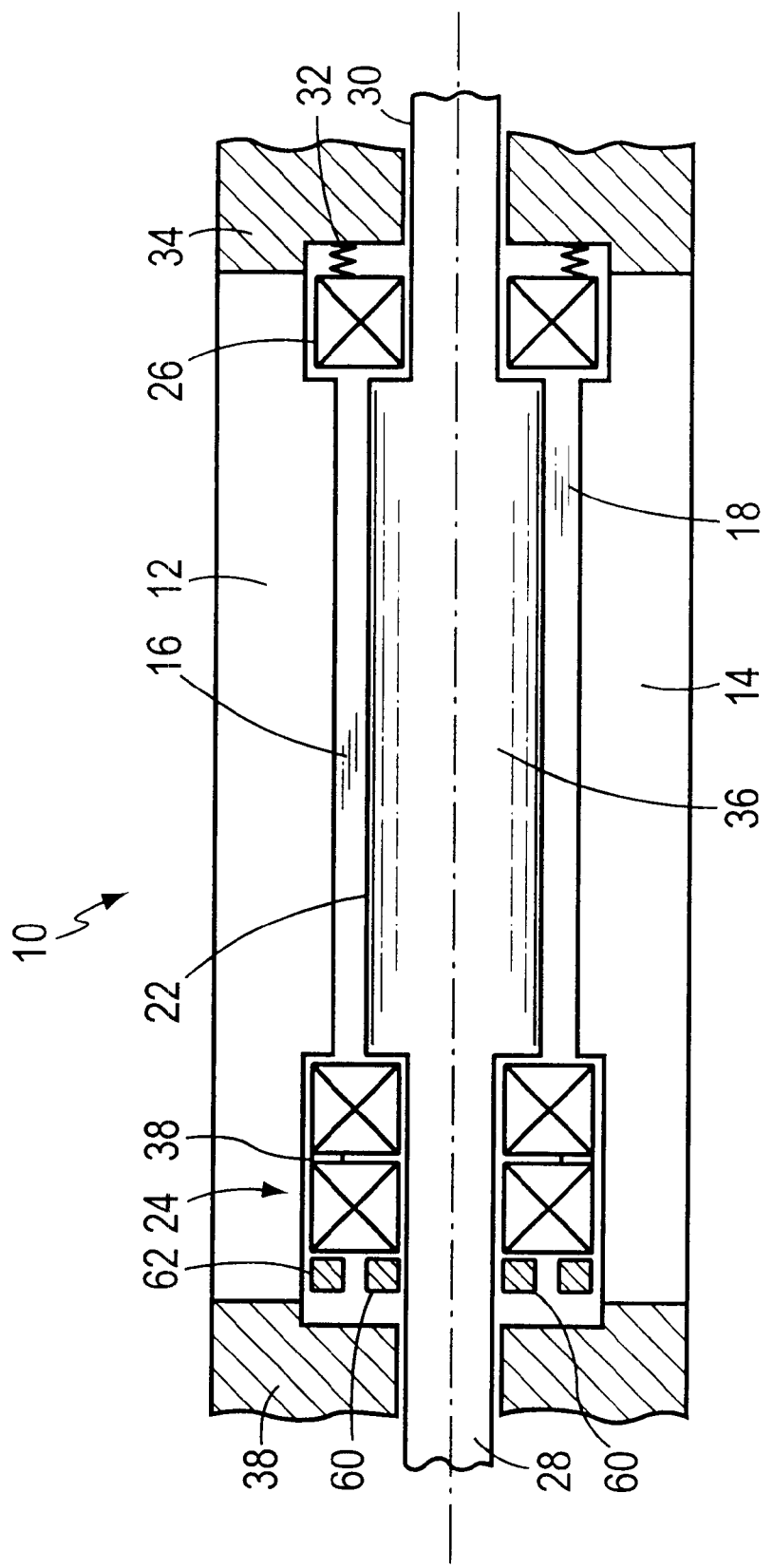
FIG. 1 is a longitudinal cross-sectional view of a galvanometer.

As shown in FIG. 1, a limited-rotation motor incorporating the invention is shown generally at 10. Motor 10 includes a stator 12, which is made up of back iron 14 and drive coils or windings 16 made up of a multiplicity of turns 18. The stator 12 surrounds a rotor 22 that is rotatably mounted on rear and front bearings 24, 26 by its rear and front shafts 28, 30, respectively. Rotor 22 includes a permanent-magnet armature 36. Essentially, limited-rotation motor 10 may rotate a beam-directing device (not shown), by angularly displacing the permanent-magnet armature 36 as a function of current flow through drive coils 16.

Figure 2:
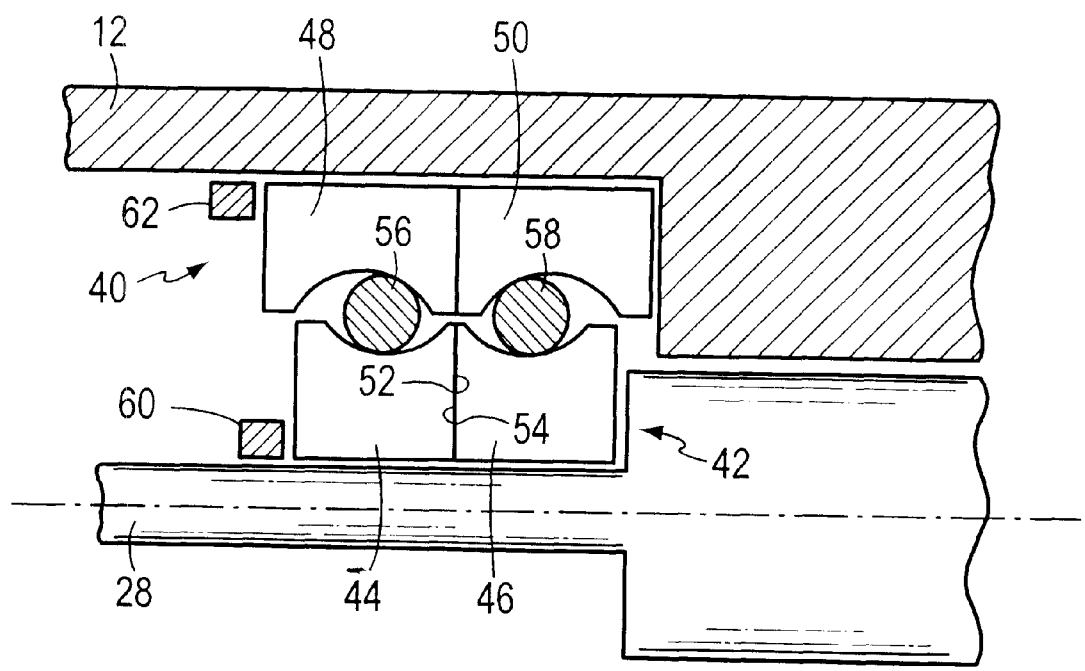
FIG. 2 is an enlarged view of a rear bearing assembly of the present invention.
Figure 3:
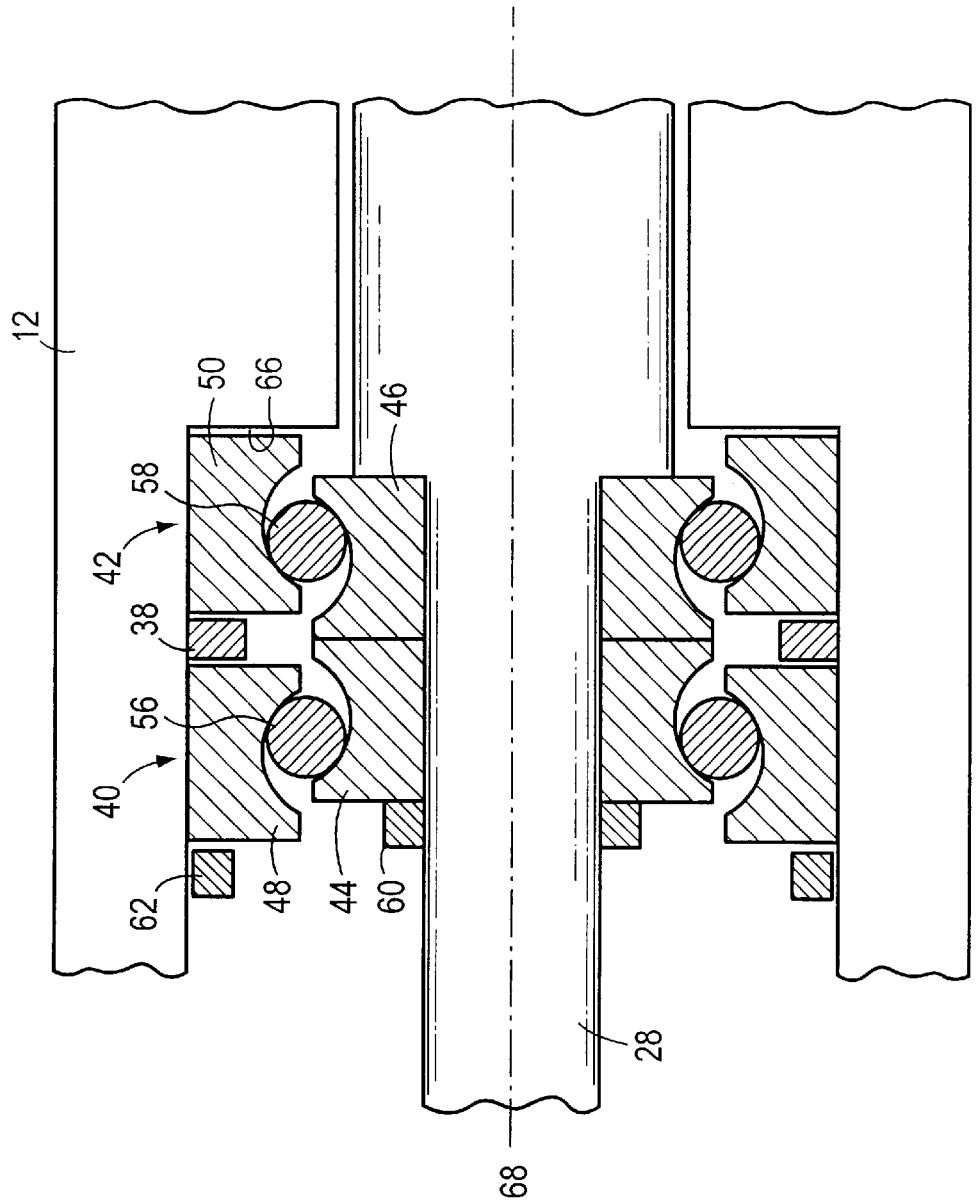
FIG. 3 is an enlarged view of the rear bearing assembly of the galvanometer of FIG. 1.

The preferred embodiment of the invention is illustrated in FIGS. 2 and 3. In this embodiment, rear bearing unit 24 comprises a pair of bearings 40, 42, having inner races 44, 46, outer races 48, 50, and balls 56, 58, respectively. In this embodiment, bearings 40, 42 are preloaded by first removing material from the opposing surfaces 52, 54 of the inner races 44 and 46. Sufficient material is removed such that the slack in both the bearings 40, 42 is eliminated when, or just before, the surfaces 52, 54 abut each other. Alternatively, rather than removing material from the opposing surfaces 52, 54, a preload may be established in bearings 40, 42 by inserting a spacing device 38 (FIG. 3) between outer races 48, 50, such that the slack in both the bearings 40, 42 is eliminated when, or just before, the surfaces 52, 54 abut each other.

With either of these arrangements, engagement of the balls 56 with the inner race 44 and the outer race 48 essentially prevents rightward movement of shaft 28 and engagement of the balls 58 with the inner race 46 and the outer race 50 essentially prevents leftward movement of the shaft 28. Specifically, any axial movement of the shaft 28 requires elastic deformation of one or the other of the bearings 40, 42 and thus is characterized by a very high spring constant. Axial motion of shaft 28, therefore, has a very low amplitude and a high resonant frequency, both of which facilitate the use of a large bandwidth in the servo loop that controls the motor 10.

The inner races 44, 46 may be held together by a variety of means, e.g., a stop 60 that cooperates in maintaining their position on the shaft 28. A stop 62, attached to stator 12, cooperates in maintaining the axial position of outer races 48, 50 relative the stator 12.

The duplex bearing set may be coupled in a preload state prior to insertion into motor 10 or it may be preloaded by first placing inner race 46 against a shoulder 66 of output shaft 28 (or by otherwise securing in position inner race 46 along output shaft 28). An axial force is then applied to inner race 44, along axis 68 and in the direction of inner race 46. As inner races 44, 46 are brought together by moving the stop 60 inwardly, a monitoring device (not shown) measures the force exerted on inner race 44. When the desired force is attained, the stop 60 is locked in place.

Alternatively, to achieve a desired preload force on rear bearing 24, rear bearing 24 may be tested prior to insertion into motor 10. For example, small amounts of material may be incrementally removed from surfaces 52, 54 so that when surfaces 52, 54 are brought together into facial contact with each other, a desired preload is achieved. In addition, varying the size of spacing device 38 may be used to achieve a desired preload.

To prevent thermally induced change in the duplex bearing unit 24, all of the components are fabricated from the same material, and thus they all have the same coefficient of thermal expansion. Unlike the semi-constant force spring employed in the prior art, the effective spring rate of the duplex bearing set is much higher, and is nonlinear, resulting in well-controlled preload and axial position under all conditions of loading and temperature. Because of this high stiffness, any resonances that may take place occur well above the bandwidth limit of the system, and thus are of no interest.

Figure 4:
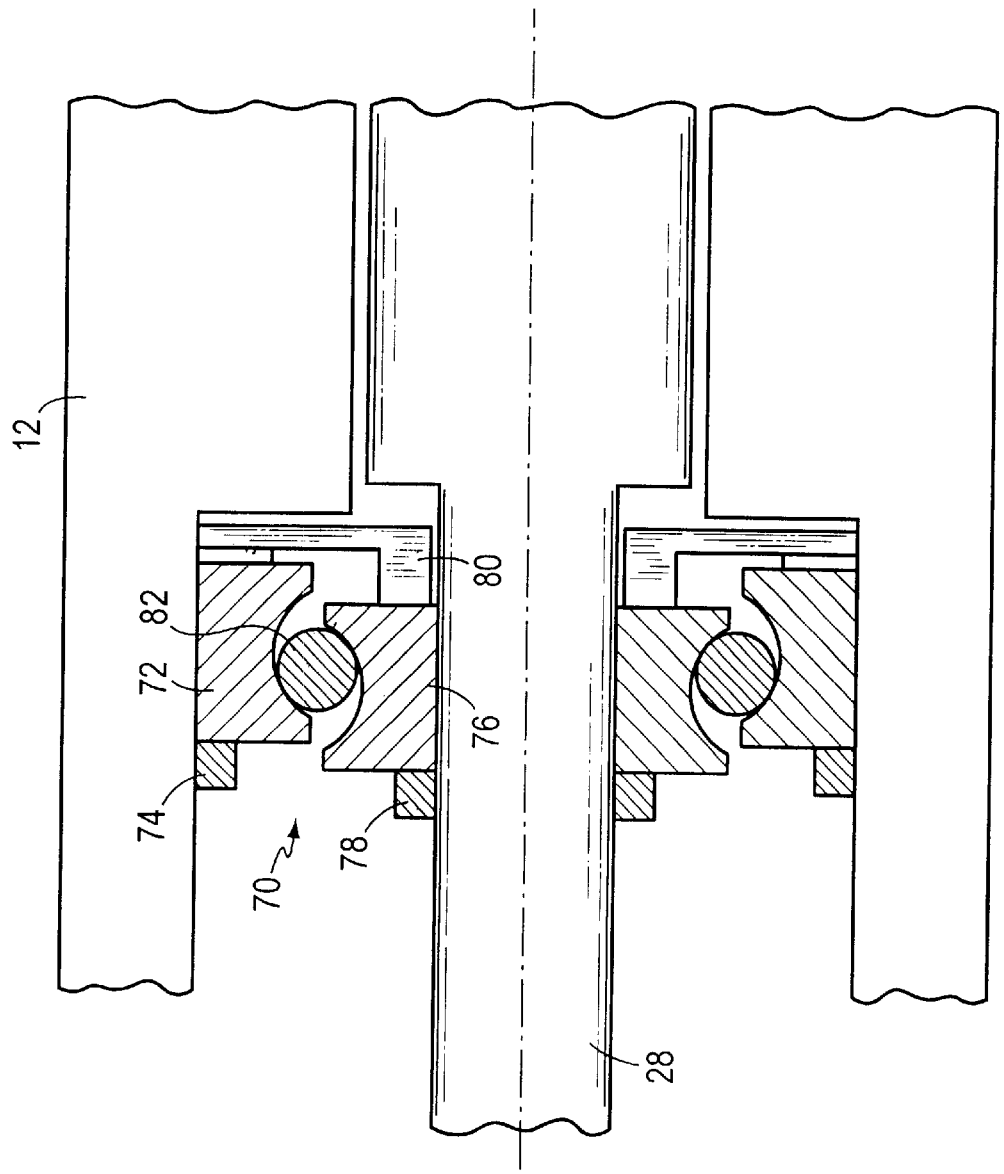
FIG. 4 is an enlarged view of an alternative rear bearing assembly of the galvanometer of FIG. 1.

Other methods exist for preloading rear bearing 24, which result in a high spring constant. As shown in FIG. 4, a single bearing 70, having an outer race 72, an inner race 76 and balls 82, is internally preloaded. Outer race 72 of bearing 70 is secured in position to stator 12 by stop 74. Inner race 76 is secured in position along output shaft 28 by stop 78 or by other means. A stiff spring 80, provides the internal preloading to bearing set 70. Engagement of the balls 82 with the inner race 76 and the outer race 72 essentially prevents leftward movement of the shaft 28 and engagement of the inner race 76 with the stiff spring 80 prevents rightward movement of the shaft 28.

The front bearings 26 (FIG. 1) are preloaded with a conventional spring assembly 32, which bears against a set of front stops 34. Spring assembly 32 preferably has a relatively low force spring constant as compared to that of bearing unit 24. This allows spring assembly 32 to accommodate small displacements of shaft 30, such as displacements due to thermal expansion of the motor components, during operation of motor 10, without inducing significant changes in the bearing loads on front bearings 26.

In summary, the preloading of bearings 24, 26 combines "hard" and "soft" spring assemblies, enabling a compliant preload to be achieved that allows for thermal expansion in service to occur without inducing high bearing loads and, which alternately raises the critical frequency of the rotating mass outside operating speed range.

In addition to the thermal forces acting on the galvanometer components, other factors tend to impart unwanted forces on the system. For example, inconsistencies in the magnetic properties along the length of cylindrical permanent-magnet armature 36, may affect the performance of these devices. As electric current is passed through the stator drive coils 16, any magnetic inconsistencies in the armature act to disrupt the balanced nature of the system and result in unwanted axial forces.

Therefore, the magnet portion of permanent-magnet armature 36 is preferably fabricated or selected from significantly uniform magnetic material, so that it has a high degree of property uniformity along its length is achieved. Present manufacturing techniques, used for producing the cylindrical magnets employed with these devices, include the pressing of magnetic material into a cylindrical mold from both ends of the mold. This technique is flawed in that it produces a cylindrical magnet that has asymmetrical magnetic properties along its length.

In the present invention, the cylindrical magnet may be formed by using a split mold, which is split along the length of the mold, whereby the magnet is pressed from the sides as well as the ends. Because a typical magnet used in these galvanometer systems has approximately a 7:1 length to diameter aspect ratio, this fabrication technique results in a cylindrical magnet having enhanced magnetic uniformity, which reduces the parasitic axial load on the rotor components.

Other factors that can cause unwanted axial force on the system include asymmetrical placement of the motor components with regard to the magnetic center of armature 36. For example, the stator drive coils 16 are positioned primarily parallel to the permanent-magnet armature 36. These parallel portions do not impart significant axial forces on the armature, however, at each end of the parallel lengths of stator drive coils 16 are rounded ends (not shown). These rounded ends are essentially perpendicular to the magnetic armature 36 and the local fields generated in these portions urge the armature 36 to move axially in either direction as an electrical current is alternately passed through drive coils 16. If the rounded ends of drive coils 16 are not symmetrically aligned with the magnetic center of permanent-magnet armature 36, an unbalanced axial force will result.

It is an additional novel feature of the present invention that the stator back iron 14, stator drive coils 16 and the rear and front bearings 24, 26 are arranged in an axially symmetric relationship with respect to the magnetic center of permanent-magnet armature 36. When sufficient symmetry is achieved, the net axial force on the magnetic armature 36 can be reduced to a pound or less, thereby greatly reducing the parasitic axial bearing forces, and prolonging the life of the rear and front bearings 24, 26.

The art will recognize other variations and modifications of the details of construction described here, while taking advantage of the principles of the invention.

What is claimed is:

1. An improvement in the method of making a galvanometer comprising a rotor and a stator, the galvanometer having a reduced axial force on the rotor, the rotor comprising a permanent-magnet armature supported at a first end and a second end for rotation relative to the stator, the stator comprising a stator back iron and stator drive coils, the improvement comprising the use of an axially extending split mold to form the armature, thereby exerting a radially inward force that on the mold to compress of the rotor the magnetic material and thereby obtain a high degree of magnetic uniformity along the axis of rotation.

2. The method of claim 1 comprising the further steps of:
    aligning the stator back iron axially symmetrically relative to the magnetic center of the armature; and
    aligning the ends of the stator drive coils axially symmetrically relative to the magnetic center of the armature.

3. The method of claim 1 including the step of pressing magnetic material into a permanent magnet shaped as a cylinder by exerting a radially inward force along the mold's length in addition to exerting an axially inward force upon each of the cylinder's ends.

4. The method of claim 2 in which the steps of using a split mold to form the armature and aligning the stator back iron and drive coil are performed so as to provide a net axial force on the rotor of one pound or less.

* * * * *